(12) United States Patent
Zang et al.

(10) Patent No.: US 11,355,537 B2
(45) Date of Patent: Jun. 7, 2022

(54) VERTICAL GATE STRUCTURE AND LAYOUT IN A CMOS IMAGE SENSOR

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 387 days.

(21) Appl. No.: 16/655,017

(22) Filed: Oct. 16, 2019

(65) Prior Publication Data

US 2021/0118925 A1 Apr. 22, 2021

(51) Int. Cl.
 H01L 27/146 (2006.01)
(52) U.S. Cl.
 CPC .. H01L 27/14605 (2013.01); H01L 27/14612 (2013.01); H01L 27/14645 (2013.01)
(58) Field of Classification Search
 CPC ......... H01L 27/14689; H01L 27/14605; H01L 27/14612; H01L 27/14645; H01L 27/14641; H01L 27/14614; H01L 27/1463; H01L 27/1464; H01L 27/14607
 See application file for complete search history.

(56) References Cited

U.S. PATENT DOCUMENTS

| 8,310,003 B2 * | 11/2012 | Kohyama | ......... H01L 27/14614 257/330 |
| 2001/0012225 A1 * | 8/2001 | Rhodes | ............. H01L 27/14643 438/69 |
| 2013/0049082 A1 * | 2/2013 | Kato | ................. H01L 27/14603 257/292 |
| 2014/0151533 A1 * | 6/2014 | Watanabe | ......... H01L 27/14887 257/228 |
| 2017/0069672 A1 * | 3/2017 | Jin | ..................... H01L 27/14614 |
| 2019/0378864 A1 * | 12/2019 | Innocent | ............... H04N 5/374 |
| 2021/0118925 A1 * | 4/2021 | Zang | .................. H01L 27/1464 |
| 2021/0167104 A1 * | 6/2021 | Rao | .................... H01L 27/14643 |
| 2021/0210532 A1 * | 7/2021 | Hung | .................. H01L 27/1464 |
| 2021/0399029 A1 * | 12/2021 | Oh | .................... H01L 27/14683 |

OTHER PUBLICATIONS

Seo et al., "A High Fill-Factor Low Dark Leakage CMOS Image Sensor with Shared-Pixel Design," Research Institute of Electronics, Shizuoka University, 3-5-1 Johoku Nakaku, Hamamatsu, Shizuoka 432-8011, Japan, SPIE col. 9022, pp. 90220M-1 to 90220M-7, Mar. 4, 2014.

\* cited by examiner

*Primary Examiner* — Jarrett J Stark
(74) *Attorney, Agent, or Firm* — Perkins Coie LLP (57) ABSTRACT

A pixel cell includes a photodiode buried beneath a first side of semiconductor material and coupled to photogenerate image charge in response to incident light. A transfer gate is disposed over the photodiode and includes a vertical transfer gate portion extending a first distance from the first side into the semiconductor material. A floating diffusion region is disposed in the semiconductor material proximate to the transfer gate and is coupled to transfer the image charge from the photodiode toward the first side of the semiconductor material and into the floating diffusion region in response to a transfer control signal. A first pixel transistor having a first gate is disposed over the photodiode proximate to the first side of the semiconductor material. The first gate has a ring structure laterally surrounding the floating diffusion region and the transfer gate at the first side of the semiconductor material.

29 Claims, 6 Drawing Sheets

VERTICAL GATE STRUCTURE AND LAYOUT IN A CMOS IMAGE SENSOR

BACKGROUND INFORMATION

Field of the Disclosure

The present invention is related generally to image sensors, and more specifically, related to image sensor pixel cells having vertical gate structures.

Background

CMOS image sensors (CIS) have become ubiquitous. They are widely used in digital still cameras, cellular phones, security cameras, as well as medical, automobile, and other applications. The technology used to manufacture image sensors has continued to advance at a great pace. The demands of higher resolution and lower power consumption have encouraged the further miniaturization and integration of these devices. As the demand for image sensors continue to be rise, isolation with high packing density and noise performance of the pixel cells in the image sensors have become increasingly challenging.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses directed to pixel cells with vertical gate structures are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, examples in accordance with the teachings of the present invention provide a pixel cell with a symmetric layout for the pixel transistors using a vertical gate structure over a buried photodiode. In various examples, the pixel cell also includes at least one or more additional gate structures of pixel transistors, such as reset transistor, a source follower transistor, and a row select transistor formed above the buried photodiode. In the example, the gate structures have circular, or closed loop, or ring structures to provide symmetric pixel cell layouts over the buried photodiode with improved isolation and low random telegraph signal (RTS) noise in accordance with the teachings of the present invention.

Figure 1A:
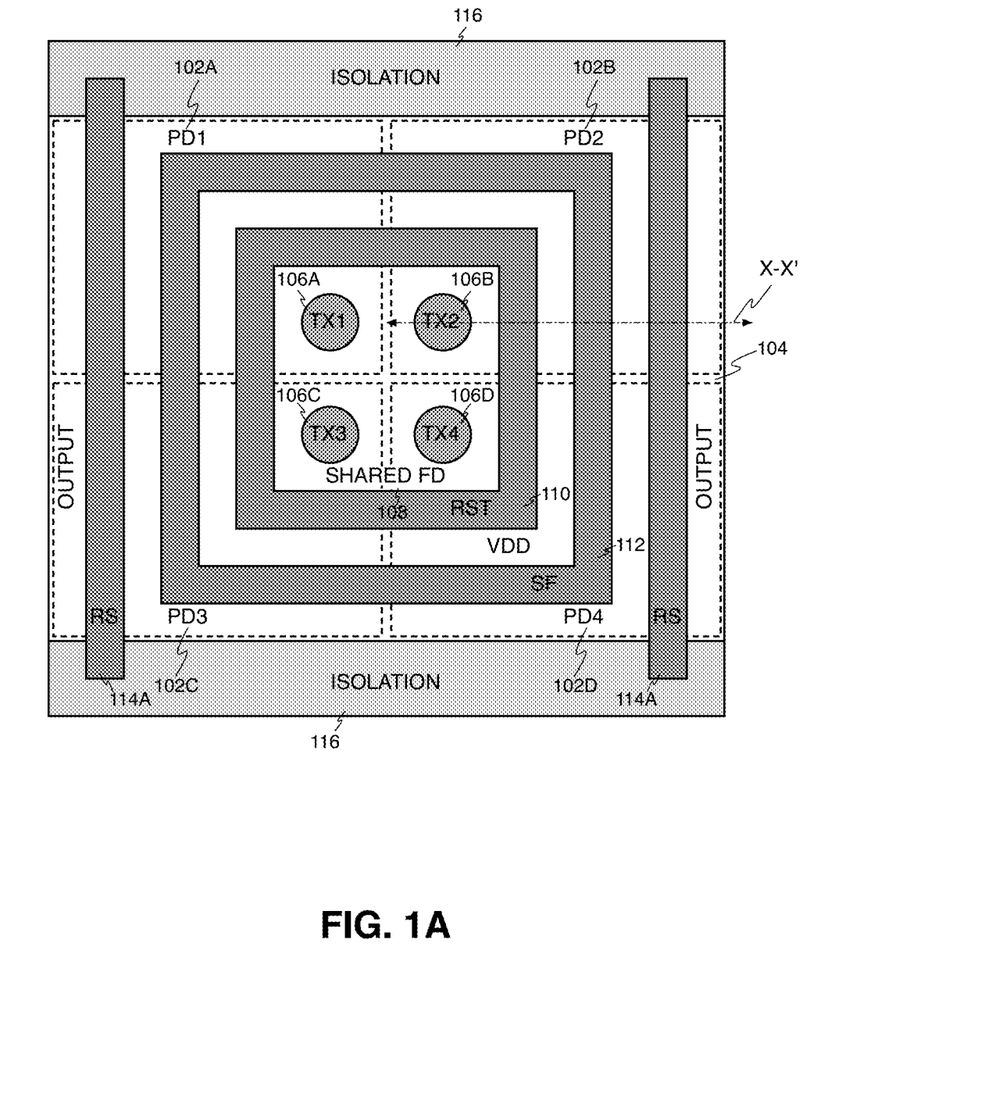
FIG. 1A is a plan view of one example a pixel cell with vertical gate structures in accordance with the teachings of the present invention.

To illustrate, FIG. 1A is a plan view of one example of a pixel cell 100A with vertical gate structures in accordance with the teachings of the present invention. In various examples, pixel cell 100A is one of a plurality of pixel cells arranged in a pixel array of an image sensor. As shown in the depicted example, pixel cell 100A includes a plurality of photodiodes including photodiode PD1 102A, photodiode PD2 102B, photodiode PD3 102C, and photodiode PD4

102D, which are buried beneath a front side surface of a semiconductor material 104. It is noted that in the depicted example, pixel cell 100A includes four photodiodes PD1 102A, PD2 102B, PD3 102C, and PD4 102D. However, in other examples, pixel cell 100A may include a different number of photodiodes. For instance, in another example, pixel cell 100A may include eight photodiodes, while in another example, pixel cell 100A may include one photodiode, etc.

Continuing with the example depicted in FIG. 1A, pixel cell 100A also includes a plurality of transfer gates of a plurality of transfer transistors including a transfer gate TX1 106A, a transfer gate TX2 106B, a transfer gate TX3 106C, and a transfer gate TX4 106D, each of which is disposed over a respective one of the plurality of photodiodes PD1 102A, PD2 102B, PD3 102C, or PD4 102D and proximate to the front side of the semiconductor material 104. As will be described in greater detail below, each transfer gate TX1 106A, TX2 106B, TX3 106C, and TX4 106D includes a vertical transfer gate portion extending a distance into the semiconductor material 104 from the front side towards the respective underlying buried photodiode PD1 102A, PD2 102B, PD3 102C, or PD4 102D.

Pixel cell 100A also includes a floating diffusion region 108 disposed in the semiconductor material 104 proximate to the plurality of transfer gates TX1 106A, TX2 106B, TX3 106C, and TX4 106D at the front side of the semiconductor material 104. In the example, the single floating diffusion region 108 is shared among the plurality of transfer gates TX1 106A, TX2 106B, TX3 106C, and TX4 106D and the plurality of photodiodes PD1 102A, PD2 102B, PD3 102C, and PD4 102D. During operation, each of the plurality of the transfer gates TX1 106A, TX2 106B, TX3 106C, and TX4 106D is coupled to transfer image charge that is photogenerated in each respective photodiode PD1 102A, PD2 102B, PD3 102C, or PD4 102D toward the front side of the semiconductor material 104 and into the shared floating diffusion region 108 in response to a respective transfer control signal.

As shown in the illustrated example, a reset gate 110 of a reset transistor is disposed over the plurality of photodiodes PD1 102A, PD2 102B, PD3 102C, and PD4 102D proximate to the front side of the semiconductor material 104. In one example, the reset gate 110 has a ring structure that laterally surrounds or completely encloses the single shared floating diffusion region 108 as well as the transfer gates TX1 106A, TX2 106B, TX3 106C, and TX4 106D at the front side of the semiconductor material 104. For purposes of this disclosure, a ring structure may be interpreted as having circular, square, or other closed looped shape structure that encloses and/or laterally surrounds the interior features, including for example the shared floating diffusion 108 and transfer gate TX1 106A, TX2 106B, TX3 106C, and TX4 106D in the instance of reset gate 110. The reset transistor is coupled to the floating diffusion region 108 as will be described in further detail below. During operation, the reset gate 110 is coupled to reset the pixel cell 100A in response to a reset control signal.

In the depicted example, pixel cell 100A also includes a source follower transistor (or an amplification transistor) having a source follower gate 112 that is disposed over the plurality of photodiodes PD1 102A, PD2 102B, PD3 102C, and PD4 102D proximate to the front side of the semiconductor material 104. As shown, the source follower gate 112 also has a ring structure laterally surrounding the reset gate 110 at the front side of the semiconductor material 104. The source follower gate 112 is configured to laterally surrounds the floating diffusion region 108 as well as transfer gates TX1 106A, TX2 106B, TX3 106C, and TX4 106D. In other words, the gate width or perimeter of source follower gate 112 is arranged to be greater than the gate width or perimeter of the reset gate 110. As will be described in further detail below, the source follower gate 112 is coupled to the floating diffusion region 108 to generate image data in response to the image charge stored in the floating diffusion region 108.

In the depicted example, pixel cell 100A also includes a row select transistor that has at least one row select gate 114A disposed proximate to the source follower gate 112 and proximate to the front side of the semiconductor material 104 such that the source follower gate 112 of the source follower transistor is disposed laterally between the reset gate 110 of the reset transistor and the row select gate 114A of the row select transistor at the front side of the semiconductor material 104. During operation, the row select gate 114A is coupled to output the image data received from the source follower to an output bitline in response to a row select signal.

As illustrated in the example depicted in FIG. 1A, pixel cell 100A includes two row select gates 114A, e.g., a first row select gate (left row select gate) and a second row select gate (right row select gate). In one embodiment, the first row select gate and the second row select gate can be connected and output (e.g., from drain of the row select transistor) to the same output bitline for example, by metal lines, to increase effective channel width of the row select transistor, and thereby improve operation speed of the row select transistor. In one embodiment, only one of the row select gates 114A is coupled to the source follower transistor, and the other is left floating to provide further isolation between pixel cell 100A and pixel circuitry of neighboring pixel cell.

The example depicted in FIG. 1A also shows that pixel cell 100A is bordered by isolation regions 116. In various examples, isolation regions 116 isolate pixel cell 100A from neighboring pixel cells in the pixel array. In one example, isolation regions 116 may include P-type implant isolation to isolate the circuit elements of pixel 100A from the neighboring circuitry of other pixel cells in the pixel array. In one example, isolation regions 116 may include shallow trench isolation (STI) structures or deep trench isolation (DTI) structure (e.g., front-side deep trench isolation) that are formed on the front side of the semiconductor material 104 and provide electrical isolation between pixel 100A and the pixel circuitry of neighboring pixel cells in the pixel array.

As can be appreciated from the design layout shown in FIG. 1A, the concentric and ring shaped gate structures of the reset gate 110 and source follower gate 112 as well as the symmetric placement of row select gates 114A outside of the source follower gate 112 on top of buried photodiodes PD1 102A, PD2 102B, PD3 102C, and PD4 102D provide a compact and symmetric design layout for pixel cell 100A without the need for shallow trench isolation (STI) structures between transistors, which make possible a high packing density for a pixel array including a plurality of pixel cells 100A. Furthermore, the location of the ring structure of the source follower gate 112 laterally outside of ring structure of the reset gate 110 of the reset transistor and enclosed transfer transistors as shown result in the source follower gate 112 having a large device width and a relatively small device gate length. As such, it is appreciated that the gate area and transconductance ($g_m$) of the source follower gate 112 is increased, which provide boosted source follower operation speed as well as reduced random telegraph sensor (RTS) noise in accordance with the teachings of the present invention. In addition, by having the reset gate 110 being ring structure enclosing photodiodes PD1 102A, PD2 102B, PD3 102C, and PD4 102D, the impact (e.g., reset noise) induced by the biasing operation to the reset gate 110 is substantially the same as to the enclosed photodiodes PD1 102A, PD2 102B, PD3 102C, and PD4 102D, which thereby reduces pixel variation.

Figure 1B:
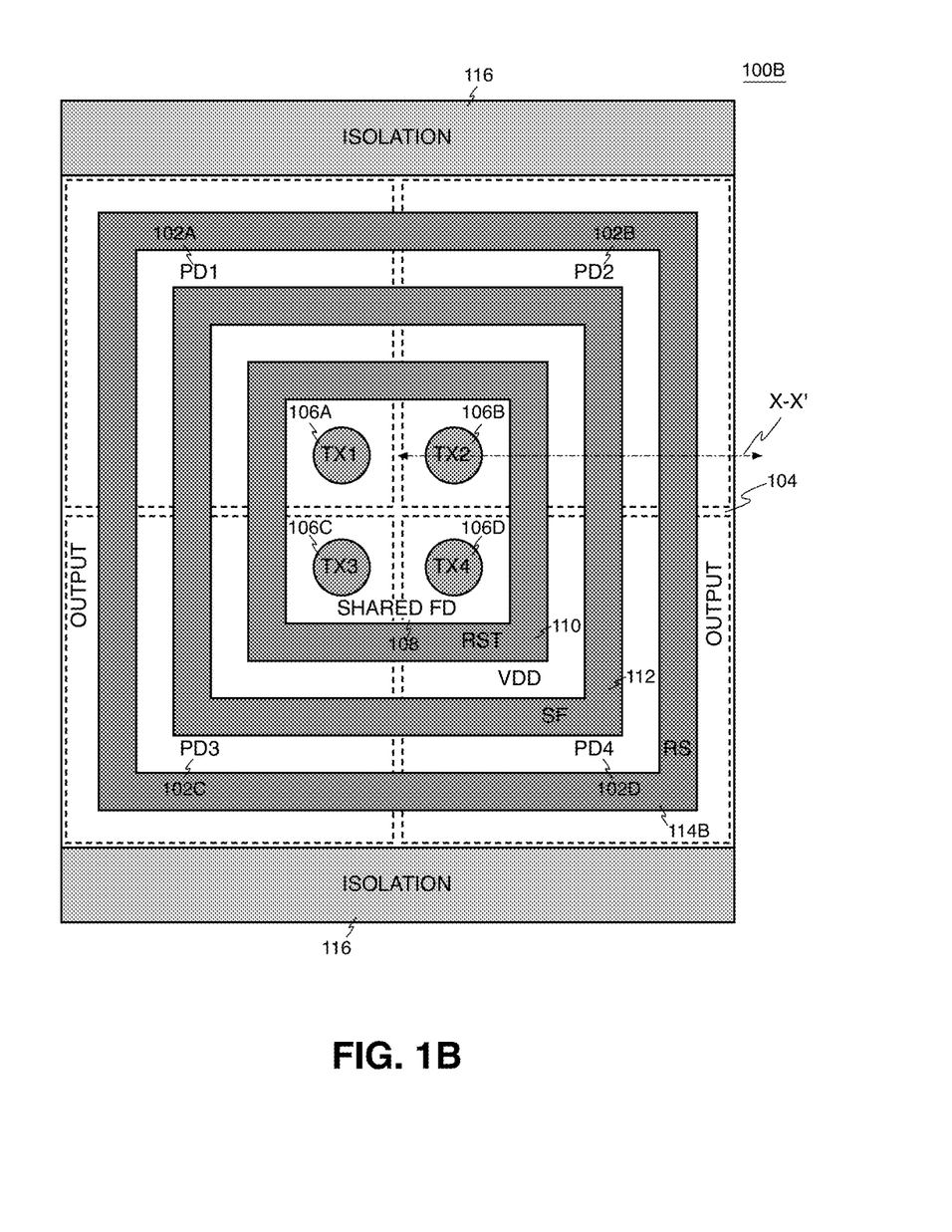
FIG. 1B is a plan view of another example a pixel cell with vertical gate structures in accordance with the teachings of the present invention.

FIG. 1B is a plan view of another example a pixel cell 100B with vertical gate structures in accordance with the teachings of the present invention. It is noted that pixel cell 100B of FIG. 1B may be another example of pixel cell 100A of FIG. 1A, and that similarly named and numbered elements referenced below are coupled and function similar to as described above. Indeed, it is appreciated that pixel cell 100B of FIG. 1B shares many similarities with pixel cell 100A of FIG. 1A. As such, it is appreciated that only the differences between pixel cell 100A and pixel cell 100B will be described in detail herein for the sake of brevity and in order to avoid obscuring the teachings of the present invention.

For instance, one difference between pixel cell 100B of FIG. 1B and pixel cell 100A of FIG. 1A is that pixel cell 100B of FIG. 1B includes a row select gate 114B of a row select transistor that also has a ring structure laterally surrounding the source follower gate 112 at the front side of the semiconductor material 104. The source follower gate 112 laterally surrounds the reset gate 110, the floating diffusion region 108, and the transfer gates TX1 106A, TX2 106B, TX3 106C, and TX4 106D at the front side of the semiconductor material 104. In other words, the reset gate 110, the source follower gate 112, and the row select gate 114B of pixel cell 100B of FIG. 1B all have ring structures that laterally surround the pixel cell elements that are disposed inside each respective ring structure.

Figure 2A:
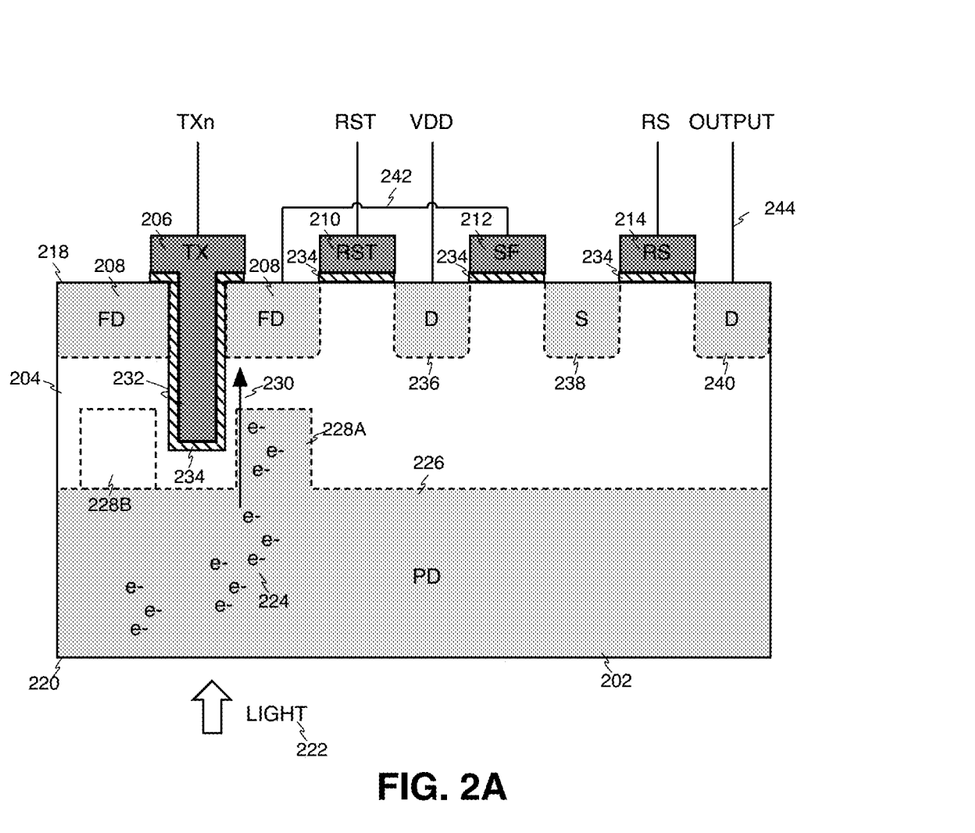
FIG. 2A is a cross-section view illustrating a portion of one example of a pixel cell with a vertical gate structure in accordance with the teachings of the present invention.

FIG. 2A is a cross-section view illustrating a portion of one example of a pixel cell 200A including a vertical gate structure in accordance with the teachings of the present invention. It is noted that the pixel cell 200A of FIG. 2A may be an example of the pixel cell 100A of FIG. 1A and/or of pixel cell 100B of FIG. 1B, and that similarly named and numbered elements referenced below are coupled and function similar to as described above. It is appreciated that the cross-section view shown in FIG. 2A may be an example of a cross-section through the transfer gate 106B, reset gate 110, source follower gate 112, and row select gate 114A or 114B of pixel cell 100A or pixel cell 100B along dashed line X-X' of FIGS. 1A-1B.

As shown in the example depicted in FIG. 2A, pixel cell 200A includes a photodiode PD 202 buried in a semiconductor material 204 beneath a first side 218 of the semiconductor material 204. In one example, semiconductor material 204 may include silicon, silicon germanium, doped silicon (e.g., p-type dope silicon or n-type doped silicon), or another suitable semiconductor material. Photodiode PD 204 is coupled to photogenerate image charge 224 in response to incident light 222. In one example, the photogenerated image charge 224 may include electrons, which are illustrated in FIG. 2A with the "e-" symbols.

In one example, photodiode PD 204 may include a deep N-type pinned photodiode (e.g., DNPPD) region 226 buried below the first side 218 the semiconductor material 204. In the example, the incident light 222 is directed through a second side 220 of semiconductor material into the photodiode PD 204. In the example, the first side 218 is a front side of the semiconductor material 204, and the second side 220 is a backside of the semiconductor material 204. Continuing with the illustrated example, the photodiode PD 204 may also include an N-type pinned photodiode (e.g., NPPD) region 228A formed in the semiconductor material 204 and disposed adjacent to the DNPPD region 226 and proximate to a vertical transfer gate portion 232 of a transfer gate 206. In other examples, it is appreciated that the polarities of the dopants and charge carriers in pixel 200A may be reversed depending on the pixel cell design, and that the examples described in this disclosure are provided for explanation purposes. As will be discussed, the NPPD region 228A provides a charge passageway 230 for the photogenerated image charge 224 to be transferred from the photodiode PD 204 toward the first side 218 (e.g., front side) of the semiconductor material 204 and into a floating diffusion region 208 in response to a respective transfer control signal TXn that is coupled to be received by the transfer gate 206.

As shown in the example, the transfer gate 206 is disposed over the photodiode PD 202 and is proximate to the first side 218 of the semiconductor material 204. In the illustrated example, the transfer gate 206 includes the vertical transfer gate portion 232, which extends a first distance or a first depth into the semiconductor material 204 from the first side 218 towards the photodiode PD 202. The floating diffusion region 206 is disposed in the semiconductor material 208 proximate to the transfer gate 206 at the first side 218 of the semiconductor material 204. As described above in the examples depicted in FIGS. 1A-1B, the floating diffusion 208 surrounds the transfer gate 206, and is therefore shown in the cross-section illustration of FIG. 2A as being on both sides of transfer gate 206 in the semiconductor material 204 at the first side 218. During operation, the transfer gate 206 is coupled to transfer the image charge 224 from the photodiode PD 202 through the charge passageway 230 provided by NPPD region 228A toward the first side 218 of the semiconductor material 204 and into the floating diffusion region 208 in response the respective transfer control signal TXn.

In the depicted example, it is noted that the NPPD region 228A providing the charge passageway 230 is illustrated as being on the reset gate 210 side (e.g., the right hand side in FIG. 2A) of the transfer gate 206. It is appreciated that in another example, the charge passageway 230 may also be, or alternatively, located on the opposite side (e.g., the left hand side in FIG. 2A) of transfer gate 206, which is illustrated in FIG. 2A with dashed lines representing an alternate NPPD region 228B.

As shown in the depicted example, the reset gate 210 of a reset transistor is also disposed over the photodiode PD 202 proximate to the first side 218 of the semiconductor material 204. A doped region 236 is formed in the semiconductor material 204 proximate to the reset gate 210 as shown. In the example, the doped region 236 is coupled to a voltage supply (e.g., VDD) and serves as a drain region (D) to the reset gate 210. As such, during operation, the reset gate 210 is coupled to reset the pixel cell 200A by resetting the image charge 224 in floating diffusion 208, as well as in the photodiode PD 202 in response to a reset control signal RST coupled to be received by the reset gate 210.

Continuing with the depicted example, a source follower gate 212 of a source follower transistor is disposed over the photodiode PD 202 proximate to the first side 218 of the semiconductor material 204 and proximate to the doped region 236 and reset gate 210 as shown. A doped region 238 is also formed in the semiconductor material 204 proximate to the source follower gate 212 as shown. In the example, the doped region 238 serves as a source region (S) to the source follower gate 210, and doped region 236 also serves as a drain region (D) to the source follower gate 212. Furthermore, the depicted example also shows that the source follower gate 212 is coupled to the floating diffusion region 208 through an electrical coupling 242 as shown. In one example, the electrical coupling 242 may be provided through contacts and a conductor included in a metal layer disposed in an interlayer dielectric formed above the first side 218 of semiconductor material 204. As such, during operation, the source follower gate 212 is coupled to the floating diffusion region 208 through electrical coupling 242 to generate image data in the source region (e.g., doped region 238) in response to the image charge 224 present in the floating diffusion region 208.

Continuing with the depicted example, a row select gate 214 of a row select transistor is disposed proximate to the doped region 238 and the source follower gate 212 as shown. In the example, the doped region 238 is disposed between the source follower gate 212 and the row select gate 214 and is proximate to the first side 218 of the semiconductor material 204 as shown. In addition, the source follower gate 212 is disposed laterally between the reset gate 210 and the row select gate 214 at the first side 218 of the semiconductor material 204. A doped region 240 is also formed in the semiconductor material 204 proximate to the row select gate 214 as shown. In the example, the doped region 238 also serves as a source region (S) to the row select gate 214, and doped region 240 serves as a drain region (D) to the row select gate 214. As such, during operation, the row select gate 214 is coupled to output the image data generated in doped region 238 by the source follower gate 212 to an output bitline 244 coupled to the doped region 240 in response to a row select signal RS coupled to be received by the row select gate 214.

The example depicted in FIG. 2A shows that pixel cell 200A also includes an insulating lining 234 that is disposed between the semiconductor material 204 and the transfer gate 206 (which includes the vertical transfer gate portion 232), the reset gate 210, the source follower gate 212, and the row select gate 214. In various examples, the insulating lining 234 may include an oxide material or the like to provide an insulation layer between the semiconductor material 204 and the transfer gate 206, the reset gate 210, the source follower gate 212, and the row select gate 214.

In one example, the doped regions 236, 238, and 240 are N-type doped regions and may have a depth of approximately 2000 Å in semiconductor material 204 from the first side 218. In one example, the DNPPD region 236 of photodiode PD 202 is formed in semiconductor material 204 at a depth of approximately 4000 Å from the first side 218.

Figure 2B:
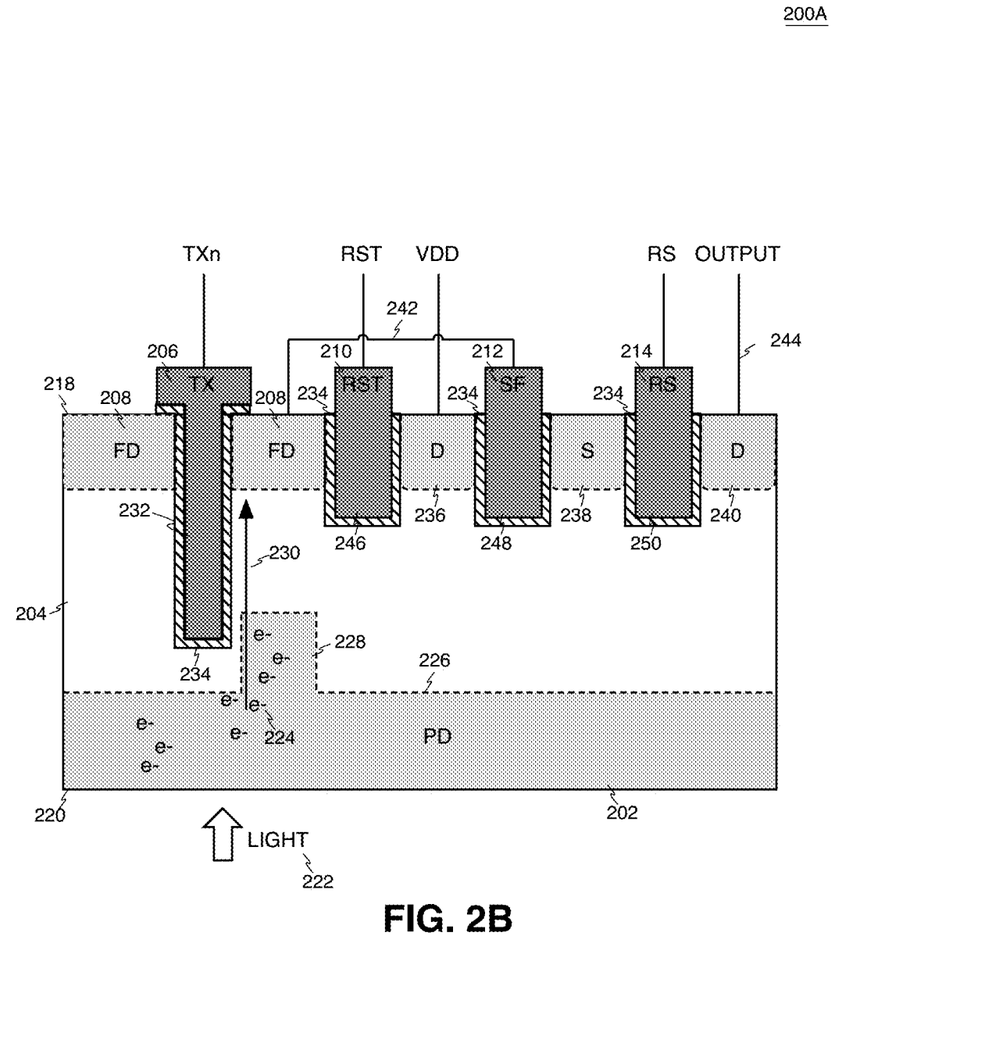
FIG. 2B is a cross-section view illustrating a portion of another example of a pixel cell with vertical gate structures in accordance with the teachings of the present invention.

FIG. 2B is a cross-section view illustrating a portion of another example of a pixel cell 200B with vertical gate structures in accordance with the teachings of the present invention. It is noted that the pixel cell 200B of FIG. 2B may be another example of the pixel cell 200A of FIG. 2A and/or the pixel cell 100A of FIG. 1A and/or of pixel cell 100B of FIG. 1B, and that similarly named and numbered elements referenced below are coupled and function similar to as described above. It is appreciated that the cross-section view shown in FIG. 2B may also be an example of a cross-section through the transfer gate 106B, reset gate 110, source follower gate 112, and row select gate 114A, 114B of pixel cell 100A or pixel cell 100B along dashed line X-X' of FIGS. 1A-1B. Indeed, it is appreciated that pixel cell 200B of FIG. 2B shares many similarities with pixel cell 200A of FIG. 2A. As such, it is appreciated that only the differences between pixel cell 200A and pixel cell 200B will be described in detail herein for the sake of brevity and in order to avoid obscuring the teachings of the present invention.

As shown, one difference between pixel cell 200B of FIG. 2B and pixel cell 200A of FIG. 2A is that reset gate 210, the source follower gate 212, and row select gate 214 of pixel 200B also include a vertical reset gate portion 246, a vertical source follower gate portion 248, and a vertical row select gate portion 250, respectively, which extend a second distance or second depth into the semiconductor material 204 from the first side 218 (e.g., front side) towards the second side 220 (e.g., backside) of the semiconductor material 204. In one example, the vertical reset gate portion 246, the vertical source follower gate portion 248, and the vertical row select gate portion 250 may have a depth of 10~300 nm in semiconductor material 204 from the first side 218. In one example, the vertical transfer gate portion 232 may have a depth of approximately 3500 Å or 350 nm in semiconductor material 204 from the first side 218. In one example, the depth that each of the vertical transfer gate portion 232, the vertical reset gate portion 246, the vertical source follower gate portion 248, and the vertical row select gate portion 250 extend into semiconductor material 204 may be the same. In one example, depth that each of the vertical transfer gate portion 232, the vertical reset gate portion 246, the vertical source follower gate portion 248, and the vertical row select gate portion 250 extend into semiconductor material 204 may be different.

In one example, it is noted that the vertical transfer gate portion 232, the vertical reset gate portion 246, the vertical source follower gate portion 248, and the vertical row select gate portion 250 may be formed during fabrication by forming vertical trenches in semiconductor material 204, coating the trenches and first side 218 with insulating lining 234, and then filling the trenches with suitable gate material. It is appreciated that the trench gate structures included in pixel 200B are scalable and may be formed by trenching all around the layout of pixel cell 200B with 1, 2, or 3 trench transistors according to various examples.

Figure 3:
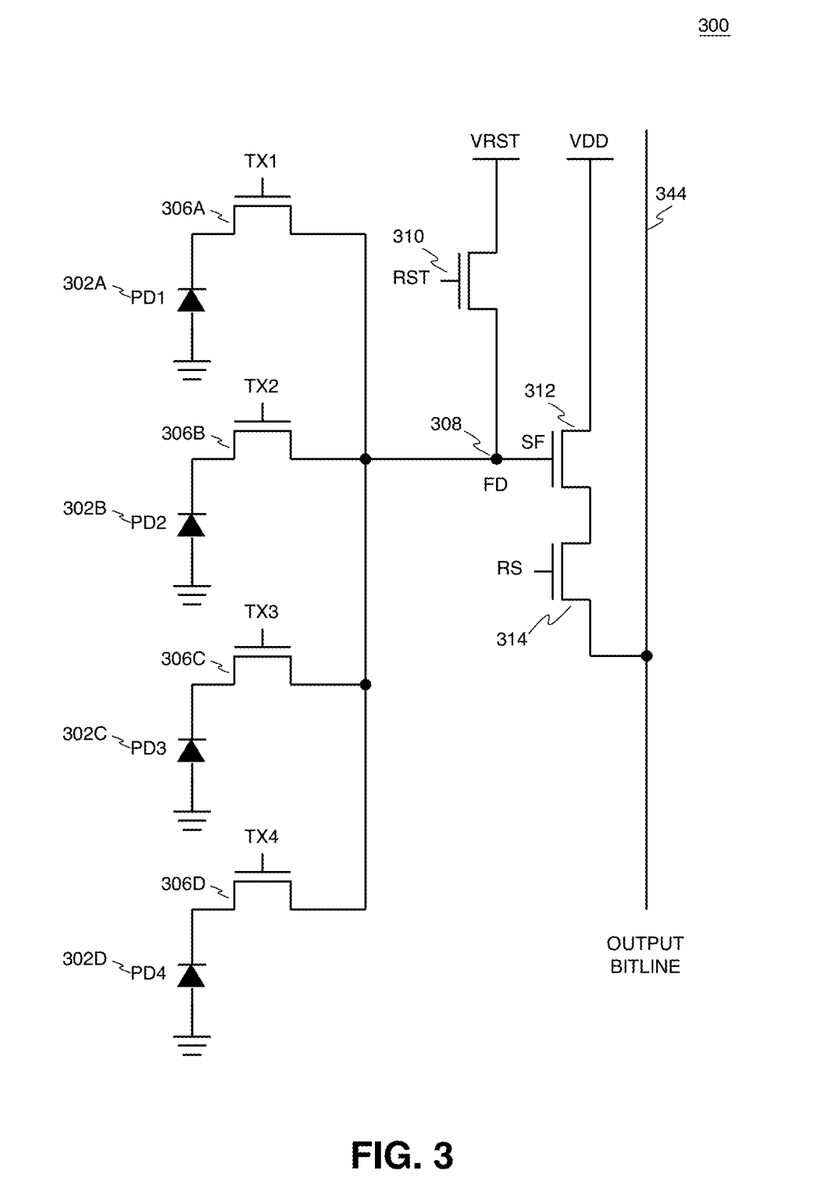
FIG. 3 is a schematic illustrating one example of a pixel cell with a plurality of photodiodes and vertical gate structures in accordance with the teachings of the present invention.

FIG. 3 is a schematic illustrating one example of a pixel cell 300 with a plurality of photodiodes and vertical gate structures in accordance with the teachings of the present invention. It is noted that the pixel cell 300 of FIG. 3 may be another example of the pixel cell 200A of FIG. 2A and/or pixel cell 200B of FIG. 2B and/or the pixel cell 100A of FIG. 1A and/or of pixel cell 100B of FIG. 1B, and that similarly named and numbered elements referenced below are coupled and function similar to as described above.

As shown in the example depicted in FIG. 3, pixel cell 300 includes a plurality of photodiodes, including photodiode PD1 302A, photodiode PD2 302B, photodiode PD3 302C, and photodiode PD4 302D. In other examples, it is appreciated that pixel cell 300 may include a fewer number of photodiodes (e.g., one photodiode in one example) or a greater number of photodiodes (e.g., eight photodiodes in another example). In the example illustrated in FIG. 3, the photodiodes PD1 302A, PD2 302B, PD3 302C, and PD4 302D are configured to photogenerate image charge in response to incident light.

A plurality of transfer transistors including transfer transistor 306A, transfer transistor 306B, transfer transistor 306C, and transfer transistor 306D, are each coupled between a floating diffusion FD 308 and a respective one of the photodiodes PD1 302A, PD2 302B, PD3 302C, and PD4 302D. In the example, the floating diffusion FD 308 is a single floating diffusion that is shared among the photodiodes PD1 302A, PD2 302B, PD3 302C, and PD4 302D and the transfer transistors 306A, 306B, 306C, and 306D. In operation, each one of the transfer transistors 306A, 306B, 306C, or 306D is coupled to transfer the image charge photogenerated in each respective photodiode PD1 302A, PD2 302B, PD3 302C, or PD4 302D to the shared floating diffusion FD 308 in response to a respective transfer control signal TX1, TX2, TX3, or TX4.

A source follower transistor (or an amplification transistor) SF 312 has a gate terminal coupled to the shared floating diffusion FD 308. In the example, the drain terminal of the source follower transistor SF 312 is coupled to a supply voltage (e.g., VDD). As such, the source follower transistor SF 312 is coupled to generate image data at the source terminal of the source follower transistor SF 312 in response to the photogenerated image charge that is stored in the floating diffusion FD 308.

A row select transistor 314 is coupled between the source terminal of the source follower transistor SF 312 and an output bitline 344 as shown. As such, the row select transistor 314 is coupled to selectively output the image data at the source terminal of the source follower transistor SF 312 in response to a row select control signal RS.

Pixel cell 300 also includes a reset transistor 310 coupled between a supply voltage (e.g., VRST) and the floating diffusion FD 308. For example, the drain terminal of the reset transistor 310 is coupled to the supply voltage VRST, and the source terminal of the reset transistor 310 is coupled to the floating diffusion FD 308. The source terminal of the reset transistor 310 is further coupled to the floating diffusion FD 308, photodiodes PD1 302A, PD2 302B, PD3 302C, and PD4 302D through the corresponding transfer transistors 306A, 306B, 306C, and 306D. As such, the reset transistor 310 is coupled to reset the pixel cell 300 in response to a reset control signal RST. For instance, reset transistor may be configured to reset the charge in the floating diffusion FD 308 as well as in the photodiodes PD1 302A, PD2 302B, PD3 302C, and PD4 302D prior to integration or after an analog to digital conversion (ADC) readout operation for example. In one example, the supply voltage VRST and the supply voltage VDD may be the same and provided from a voltage supply source.

In summary, in various examples, an image sensor includes a pixel array having at least one pixel cell that may be another example of the pixel cell 200A of FIG. 2A and/or pixel cell 200B of FIG. 2B and/or the pixel cell 100A of FIG. 1A and/or of pixel cell 100B of FIG. 1B in accordance with the teachings of the present invention.

The pixel cell includes a semiconductor material, at least a photodiode, at least a transfer transistor, a floating diffusion region, and a first pixel transistor. In one embodiment, the semiconductor material may include silicon, silicon germanium or another suitable semiconductor material. In one example, the semiconductor material may include a doped silicon substrate, such as a p-type doped silicon substrate, or n-type doped silicon substrate). The semiconductor material has a first side (e.g., a front side) and a second side (e.g., a backside) opposite to the first side.

The photodiode is buried in the semiconductor material beneath a first side of the semiconductor material. The photodiode is coupled to photogenerate image charge in response to incident light. In one example, the photodiode photogenerates image charge in response to incident light received through the second side of the semiconductor material.

The transfer transistor has a transfer gate that is disposed over the photodiode proximate to the first side of the semiconductor material, and the transfer gate includes a vertical transfer gate portion that is arranged to extend a first distance or a first depth into the semiconductor material from the first side towards the photodiode. The floating diffusion region disposed in the semiconductor material proximate to the transfer gate at the first side of the semiconductor material. The transfer gate is coupled to transfer the image charge from the photodiode toward the first side of the semiconductor material and into the floating diffusion region in response to a transfer control signal.

In other examples, without departing from teachings of present invention, pixel cell may include two, four, eight, or more photodiodes depend on pixel array arrangement and/or performance requirements, e.g., resolution, dynamic range of the image sensor. In one embodiment, the pixel cell includes four photodiodes and four transfer transistors as illustrated in FIGS. 1A-1B. Each of four transfer transistors is configured to couple each photodiode to the floating diffusion region to transfer the photogenerated image charge from the respective photodiode toward the floating diffusion region in response to the transfer control signal received at the transfer gate thereof.

The first pixel transistor is coupled to the floating diffusion region. The first pixel transistor has a first gate disposed over the photodiode proximate to the first side of the semiconductor material. The first gate of the first pixel transistor has a ring structure (e.g., circular, square, or other closed looped shape structure) that is configured to laterally surround or enclose the floating diffusion region and the transfer gate at the first side of the semiconductor material.

In some embodiments, the pixel cell may further include a second pixel transistor and a third pixel transistor. The second pixel transistor is coupled to the floating diffusion region. The second pixel transistor having a second gate disposed over the photodiode proximate to the first side of the semiconductor material. The second gate of a second pixel transistor has a ring structure laterally surrounding the first gate of the first pixel transistor. The third pixel transistor has a third gate disposed proximate to the second gate of the second pixel transistor proximate to the first side of the semiconductor material such that the second gate of the second pixel transistor is disposed laterally between the first gate of the first pixel transistor and the third gate of the third pixel transistor at the first side of the semiconductor material, for example as illustrated in FIG. 1A.

In one example, the third gate of third pixel transistor also has a ring structure laterally surrounding the second gate of the second pixel transistor at the first side of the semiconductor material, for example as illustrated in FIG. 1B.

In one example, the first pixel transistor may be a reset transistor, and the first gate may be a reset gate. The reset transistor is coupled to the floating diffusion region and the one or more photodiodes in the pixel cell to reset the pixel cell in response to a reset control signal received at the reset gate, for example during a reset operation of the image sensor. The second pixel transistor may be a source follower, and the second gate may be a source follower gate coupled to the floating diffusion region to generate image data in response to the image charge stored in the floating diffusion region. The third pixel transistor may be a row select transistor. The third gate may a row select gate coupled to an output bitline and output the image data to the output bitline in response to a row select signal, for example during a read out operation of image sensor.

In some embodiments, the reset gate of the reset transistor, the source follower gate of the source follower transistor, and the row select gate of the row select transistor include a vertical reset gate portion, a vertical source follower gate portion, and a vertical row select gate portion, respectively. Each of the vertical reset gate portion, the vertical source follower gate portion, and the vertical row select gate portion may be arranged to extend a second distance or a second depth into the semiconductor material from the first side towards the second side of the semiconductor material, for example as illustrated in FIG. 2B, to further to increase gate length of the reset transistor, the source follower transistor, and the row select transistor, and improve further on the random telegraph signal (RTS) noise associated the pixel transistors.

Figure 4:
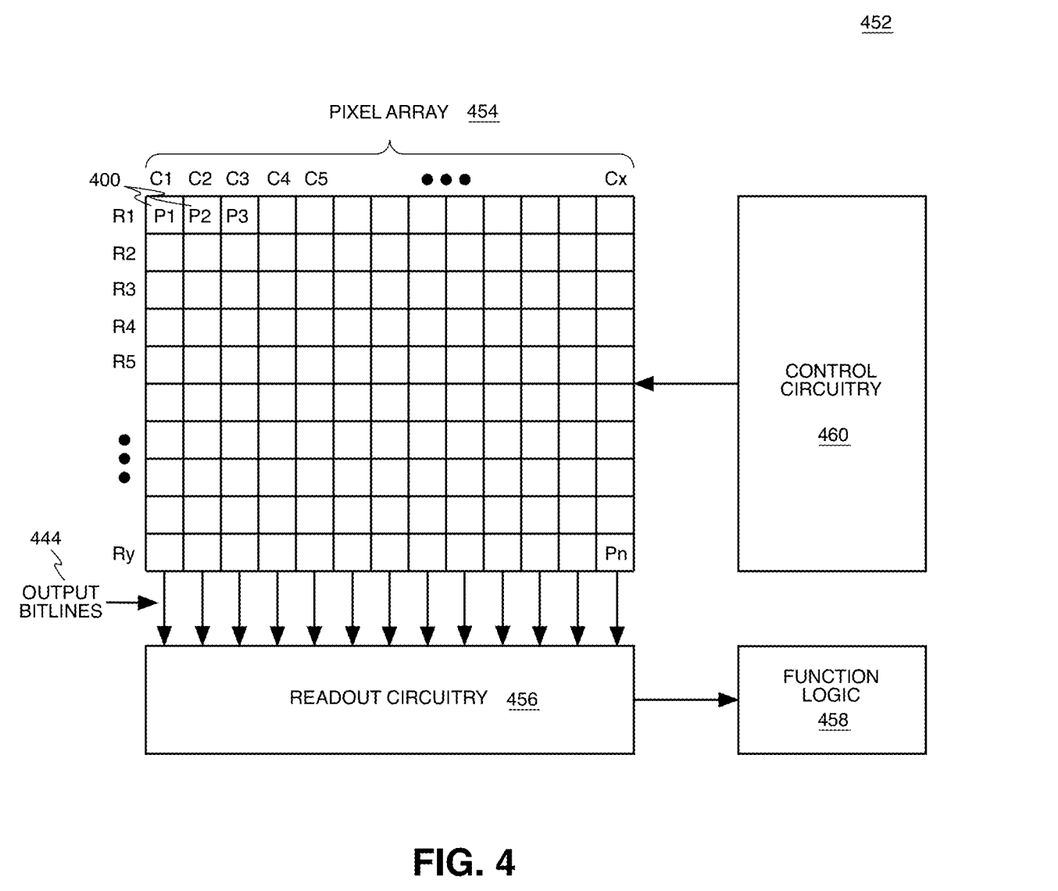
FIG. 4 is a diagram illustrating one example of an imaging system including a pixel array having pixel cells with vertical gate structures in accordance with the teachings of the present invention.

FIG. 4 is a diagram illustrating one example of an imaging system 452 including a pixel array having pixel cells with vertical gate structures in accordance with the teachings of the present invention. As shown in the depicted example, an imaging system 452 includes a pixel array 454 coupled to a control circuitry 460 and a readout circuitry 456, which is coupled to a function logic 458.

In one example, the pixel array 454 is a two-dimensional (2D) array of image sensor pixel cells 400 (e.g., pixels P1, P2, P3, . . . , Pn). It is noted that each pixel cell 400 of FIG. 4 may be an example of pixel cell 300 of FIG. 3 and/or pixel cell 200A of FIG. 2A and/or pixel cell 200B of FIG. 2B and/or the pixel cell 100A of FIG. 1A and/or of pixel cell 100B of FIG. 1B, and that similarly named and numbered elements referenced below are coupled and function similar to as described above. As illustrated, each pixel cell 400 is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell 400 has acquired its image data or image charge, the image data is readout by the readout circuitry 456 through output bitlines 444 and then transferred to the function logic 458. In various examples, readout circuitry 456 may include amplification circuitry, analog-to-digital conversion (ADC) circuitry, or otherwise. Function logic 458 may include logic and memory for storing the image data or even manipulating the image data by applying post image effects (e.g., crop, rotate, remove red eye, adjust brightness, adjust contrast, or otherwise). In one example, the readout circuitry 456 may readout a row of image data at a time along readout column output bitlines 444 (illustrated) or may readout the image data using a variety of other techniques (not illustrated), such as a serial readout or a full parallel readout of all pixels simultaneously.

In one example, the control circuitry 460 is coupled to the pixel array 454 and may include logic and memory for controlling operational characteristics of the pixel array 454. In one example, the control circuitry 460 may be coupled to generate global shutter and/or control signals discussed above for controlling image acquisition for each pixel cell 400. In an example with a global shutter, the global shutter and control signals simultaneously enable all pixel cells 400 within pixel array 454 to globally transfer the image charge from each photodiode to respective global shutter storage transistors during a single acquisition window in accordance with the teachings of the present invention.

In one example, imaging system 452 may be included in a digital camera, cell phone, laptop computer, or the like. Additionally, imaging system 452 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 452, extract image data from imaging system 452, or manipulate image data supplied by imaging system 452.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
a photodiode buried in a semiconductor material beneath a first side of the semiconductor material, wherein the photodiode is coupled to photogenerate image charge in response to incident light;
a transfer gate disposed over the photodiode proximate to the first side of the semiconductor material, wherein the transfer gate includes a vertical transfer gate portion extending a first distance into the semiconductor material from the first side towards the photodiode;
a floating diffusion region disposed in the semiconductor material proximate to the transfer gate at the first side of the semiconductor material, wherein the transfer gate is coupled to transfer the image charge from the photodiode toward the first side of the semiconductor material and into the floating diffusion region in response to a transfer control signal; and
a reset gate disposed over the photodiode proximate to the first side of the semiconductor material, wherein the reset gate has a ring structure laterally surrounding the floating diffusion region and the transfer gate at the first side of the semiconductor material, wherein the reset gate is coupled to reset the pixel cell in response to a reset control signal.

2. The pixel cell of claim 1, further comprising a source follower gate disposed over the photodiode proximate to the first side of the semiconductor material, wherein the source follower gate has a ring structure laterally surrounding the reset gate at the first side of the semiconductor material, wherein the source follower gate is coupled to the floating diffusion region to generate image data in response to the image charge stored in the floating diffusion region.

3. The pixel cell of claim 2, further comprising a row select gate disposed proximate to the source follower gate proximate to the first side of the semiconductor material such that the source follower gate is disposed laterally between the reset gate and the row select gate at the first side of the semiconductor material, wherein the row select gate is coupled to output the image data to an output bitline in response to a row select signal.

4. The pixel cell of claim 3, further comprising insulating lining disposed between the semiconductor material and the transfer gate, the reset gate, the source follower gate, and the row select gate.

5. The pixel cell of claim 3, wherein the row select gate has a ring structure laterally surrounding the source follower gate at the first side of the semiconductor material.

6. The pixel cell of claim 3, wherein the reset gate, the source follower gate, and row select gate include a vertical reset gate portion, a vertical source follower gate portion, and a vertical row select gate portion, respectively, extending a second distance into the semiconductor material from the first side towards a second side of the semiconductor material, wherein the second side of the semiconductor material is opposite from the first side of the semiconductor material.

7. The pixel cell of claim 1, wherein the first side of the semiconductor material is a front side of the semiconductor material, and wherein the second side of the semiconductor material is a backside of the semiconductor material.

8. The pixel cell of claim 1, wherein the photodiode comprises a deep pinned photodiode region buried in the semiconductor material below the first side of the semiconductor material.

9. The pixel cell of claim 8, wherein the photodiode further comprises a pinned photodiode region disposed adjacent to the deep pinned photodiode region and proximate to the vertical transfer gate portion of the transfer gate in the semiconductor material, wherein the pinned photodiode region provides a charge passageway for the image charge to be transferred from the photodiode toward the first side of the semiconductor material and into the floating diffusion region in response to the transfer control signal.

10. The pixel cell of claim 1,
wherein the photodiode is one of a plurality of photodiodes and wherein the transfer gate is one of a plurality of transfer gates included in the pixel cell, wherein each one of the plurality of transfer gates is disposed over respective one of the plurality of photodiodes proximate to the first side of the semiconductor material, wherein each one of the plurality of transfer gate includes a respective vertical transfer gate portion extending the first distance into the semiconductor material from the first side towards the respective one of the plurality of photodiodes,
wherein the floating diffusion region is disposed proximate to the plurality of transfer gates at the first side of the semiconductor material such that the floating diffusion is shared among the plurality of transfer gates and the plurality of photodiodes, and
wherein each one of the plurality of transfer gates is coupled to transfer the image charge from the respective one of the plurality of photodiodes toward the first side of the semiconductor material and into the floating diffusion region in response to a respective one of a plurality of transfer control signals.

11. The pixel cell of claim 10, wherein the plurality of diodes includes four photodiodes and wherein the plurality of transfer gates includes four transfer gates.

12. An imaging system, comprising:
a pixel array of pixel cells, wherein each one of the pixel cells includes:
a photodiode buried in a semiconductor material beneath a first side of the semiconductor material, wherein the photodiode is coupled to photogenerate image charge in response to incident light;
a transfer gate disposed over the photodiode proximate to the first side of the semiconductor material, wherein the transfer gate includes a vertical transfer gate portion extending a first distance into the semiconductor material from the first side towards the photodiode;
a floating diffusion region disposed in the semiconductor material proximate to the transfer gate at the first side of the semiconductor material, wherein the transfer gate is coupled to transfer the image charge from the photodiode toward the first side of the semiconductor and into the floating diffusion region in response to a transfer control signal; and
a reset gate disposed over the photodiode proximate to the first side of the semiconductor material, wherein the reset gate has a ring structure laterally surrounding the floating diffusion region and the transfer gate at the first side of the semiconductor material, wherein the reset gate is coupled to reset the pixel cell in response to a reset control signal;
a control circuitry coupled to the pixel array to control operation of the pixel array; and
a readout circuitry coupled to the control pixel array to read out image data from the plurality of pixel cells.

13. The imaging system of claim 12, further comprising function logic coupled to the readout circuitry to store the image data from each one of the plurality of pixel cells.

14. The imaging system of claim 12, further comprising a source follower gate disposed over the photodiode proximate to the first side of the semiconductor material, wherein the source follower gate has a ring structure laterally surrounding the reset gate at the first side of the semiconductor material, wherein the source follower gate is coupled to the floating diffusion region to generate image data in response to the image charge stored in the floating diffusion region.

15. The imaging system of claim 14, further comprising a row select gate disposed proximate to the source follower gate proximate to the first side of the semiconductor material such that the source follower gate is disposed laterally between the reset gate and the row select gate at the first side of the semiconductor material, wherein the row select gate is coupled to output the image data to an output bitline in response to a row select signal.

16. The imaging system of claim 15, further comprising insulating lining disposed between the semiconductor material and the transfer gate, the reset gate, the source follower gate and the row select gate.

17. The imaging system of claim 15, wherein the row select gate has a ring structure laterally surrounding the source follower gate at the first side of the semiconductor material.

18. The imaging system of claim 15, wherein the reset gate, the source follower gate, and row select gate include a vertical reset gate portion, a vertical source follower gate portion, and a vertical row select gate portion, respectively, extending a second distance into the semiconductor material from the first side towards a second side of the semiconductor material, wherein the second side of the semiconductor material is opposite from the first side of the semiconductor material.

19. The imaging system of claim [[18]]12, wherein the first side of the semiconductor material is a front side of the semiconductor material, and wherein the second side of the semiconductor material is a backside of the semiconductor material.

20. The imaging system of claim 12, wherein the photodiode comprises a deep pinned photodiode region buried in the semiconductor material below the first side of the semiconductor material.

21. The imaging system of claim 20, wherein the photodiode further comprises a pinned photodiode region disposed adjacent to the deep pinned photodiode region and proximate to the vertical transfer gate portion of the transfer gate in the semiconductor material, wherein the pinned photodiode region provides a charge passageway for the image charge to be transferred from the photodiode toward the first side of the semiconductor material and into the floating diffusion region in response to the transfer control signal.

22. The imaging system of claim 12,
wherein the photodiode is one of a plurality of photodiodes and wherein the transfer gate is one of a plurality of transfer gates included in the pixel cell, wherein each one of the plurality of transfer gates is disposed over respective one of the plurality of photodiodes proximate to the first side of the semiconductor material, wherein each one of the plurality of transfer gate includes a respective vertical transfer gate portion extending the first distance into the semiconductor material from the first side towards the respective one of the plurality of photodiodes,
wherein the floating diffusion region is disposed proximate to the plurality of transfer gates at the first side of the semiconductor material such that the floating diffusion is shared among the plurality of transfer gates and the plurality of photodiodes, and
wherein each one of the plurality of transfer gates is coupled to transfer the image charge from the respective one of the plurality of photodiodes toward the first side of the semiconductor material and into the floating diffusion region in response to a respective one of a plurality of transfer control signals.

23. The imaging system of claim 22, wherein the plurality of diodes includes four photodiodes and wherein the plurality of transfer gates includes four transfer gates.

24. A pixel cell, comprising:
a photodiode buried in a semiconductor material beneath a first side of the semiconductor material, wherein the photodiode is coupled to photogenerate image charge in response to incident light;
a transfer gate disposed over the photodiode proximate to the first side of the semiconductor material, wherein the transfer gate includes a vertical transfer gate portion extending a first distance into the semiconductor material from the first side towards the photodiode;
a floating diffusion region disposed in the semiconductor material proximate to the transfer gate at the first side of the semiconductor material, wherein the transfer gate is coupled to transfer the image charge from the photodiode toward the first side of the semiconductor material and into the floating diffusion region in response to a transfer control signal; and
a first pixel transistor having a first gate disposed over the photodiode proximate to the first side of the semiconductor material, wherein the first gate has a ring structure laterally surrounding the floating diffusion region and the transfer gate at the first side of the semiconductor material.

25. The pixel cell of claim 24, wherein the first pixel transistor is coupled to the floating diffusion region.

26. The pixel cell of claim 24, further comprising a second pixel transistor having a second gate disposed over the photodiode proximate to the first side of the semiconductor material, wherein the second gate of a second pixel transistor has a ring structure laterally surrounding the first gate at the first side of the semiconductor material.

27. The pixel cell of claim 26, further comprising a third pixel transistor having a third gate disposed proximate to the second gate of the second pixel transistor proximate to the first side of the semiconductor material such that the second gate of the second pixel transistor is disposed laterally between the first gate of the first pixel transistor and the third gate of the third pixel transistor at the first side of the semiconductor material.

28. The pixel cell of claim 27, wherein the third gate of the third pixel transistor has a ring structure laterally surrounding the second gate of the second pixel transistor at the first side of the semiconductor material.

29. The pixel cell of claim 27,
wherein the first pixel transistor is a reset transistor, and the first gate is a reset gate, wherein the reset gate is coupled to reset the pixel cell in response to a reset control signal,
wherein the second pixel transistor is a source follower, and the second gate is a source follower gate coupled to the floating diffusion region to generate image data in response to the image charge stored in the floating diffusion region, and
wherein the third pixel transistor is a row select transistor, and the third gate is a row select gate coupled to output the image data to an output bitline in response to a row select signal.

* * * * *

UNITED STATES PATENT AND TRADEMARK OFFICE
CERTIFICATE OF CORRECTION

| | |
|---|---|
| PATENT NO. | : 11,355,537 B2 |
| APPLICATION NO. | : 16/655017 |
| DATED | : June 7, 2022 |
| INVENTOR(S) | : Hui Zang et al. |

It is certified that error appears in the above-identified patent and that said Letters Patent is hereby corrected as shown below:

In the Claims

In Column 14, Line 63, delete "claim [[18]]12," and insert -- claim 12, --, therefor.

Signed and Sealed this
Thirteenth Day of December, 2022

Katherine Kelly Vidal
Director of the United States Patent and Trademark Office